(12) United States Patent
Hanawa et al.

(10) Patent No.: US 8,183,715 B2
(45) Date of Patent: May 22, 2012

(54) REVERSE CURRENT PREVENTING CIRCUIT AND POWER SOURCE SWITCHING APPARATUS

(75) Inventors: Daisuke Hanawa, Tama (JP); Osamu Kawagoe, Tama (JP); Tomiyuki Nagai, Tama (JP); Hitoshi Tabuchi, Tama (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 265 days.

(21) Appl. No.: 12/717,557

(22) Filed: Mar. 4, 2010

(65) Prior Publication Data

US 2010/0225169 A1    Sep. 9, 2010

(30) Foreign Application Priority Data

Mar. 5, 2009    (JP) ................................. 2009-051704

(51) Int. Cl.
*H02J 3/00*    (2006.01)
(52) U.S. Cl. .......... 307/86; 307/125; 307/127; 307/131; 327/407; 327/408; 327/534
(58) Field of Classification Search .................... 307/43, 307/85–87, 115–116, 125–131; 327/389, 327/391, 407–408, 427, 434, 437, 534, 538, 327/543; 361/58, 84, 93.9
See application file for complete search history.

(56) References Cited

U.S. PATENT DOCUMENTS

| | | | | |
|---|---|---|---|---|
| 5,422,583 A * | 6/1995 | Blake et al. | ...................... | 327/94 |
| 5,644,266 A * | 7/1997 | Chen et al. | ..................... | 327/534 |
| 6,291,857 B1 * | 9/2001 | Hirano | .......................... | 257/350 |
| 6,304,110 B1 * | 10/2001 | Hirano | .......................... | 327/108 |
| 6,333,571 B1 * | 12/2001 | Teraoka et al. | ................ | 307/125 |
| 7,148,587 B2 * | 12/2006 | Matsuda et al. | ................ | 307/80 |
| 2007/0096780 A1 * | 5/2007 | White | ........................... | 327/112 |
| 2008/0224736 A1 * | 9/2008 | Terashima | .................... | 327/108 |

FOREIGN PATENT DOCUMENTS

| | | |
|---|---|---|
| JP | 63-307510 A | 12/1988 |
| JP | 2004-280704 A | 10/2004 |

* cited by examiner

*Primary Examiner* — Jared Fureman
*Assistant Examiner* — Alfonso Perez Borroto
(74) *Attorney, Agent, or Firm* — Holtz, Holtz, Goodman & Chick, PC

(57) ABSTRACT

A reverse current preventing circuit of an N channel type switching MOS transistor connected between a voltage input terminal and an output terminal to control a conduction state between the voltage input terminal and the output terminal, the circuit comprises: a first MOS transistor connected between a substrate of the switching MOS transistor and a ground point; and a second MOS transistor connected between the substrate of the switching MOS transistor and a point having a piece of predetermined constant potential higher than that of the ground point, wherein the piece of predetermined constant potential higher than that of the ground point is applied to the substrate of the switching MOS transistor while the switching MOS transistor is made to be in its on-state, and ground potential is applied to the substrate of the switching MOS transistor while the switching MOS transistor is made to be in its off-state.

7 Claims, 5 Drawing Sheets

US 8,183,715 B2

REVERSE CURRENT PREVENTING CIRCUIT AND POWER SOURCE SWITCHING APPARATUS

TECHNICAL FIELD

The present invention relates to a reverse current preventing technique of a transistor transmitting a direct-current (DC) voltage and further a power source switching apparatus for selecting a DC voltage from any one of a plurality of DC power sources to supply the selected DC voltage to a load, and relates to, for example, a technique effective for the use of a power source switching integrated circuit (IC) (semiconductor integrated circuit) for selecting a DC voltage from a battery or an alternating-current (AC) adaptor.

BACKGROUND ART

A battery has widely been used as a power source of a portable electronic device, such as a game machine and a portable music player. The operation of such a portable electronic device stops when the residual quantity of the battery thereof has decreased. Accordingly, the user thereof sometimes continues the operation thereof by connecting an AC adaptor without exchanging the battery. In such a case, it is desirable for internal circuits from the point of view of their stability to perform their operations by the use of the DC voltage from the AC adaptor in place of the power source voltage from the battery.

Accordingly, a power source switching apparatus having the function of selecting the DC voltage of any one of a plurality of DC power sources to supply the selected voltage to a load has been provided in the past. A transistor, such as a metal oxide semiconductor (MOS) field-effect transistor (FET) (or insulated-gate field-effect transistor; hereinafter referred to as MOS transistor), is used for a switching switch in such a power source switching apparatus.

There are P channel type MOS FET and N channel type MOS FET. If an N channel MOS FET is used as a switching element for the transmission/interception of a DC voltage in a power source switching apparatus, such a switching element has a problem of the enlargement of the circuit size thereof owing to a charge pump, which becomes necessary to be provided because the channel of the switching MOS FET conducts in a state in which the potential of the source thereof and the drain thereof is nearly a power source voltage in the on-state thereof and the on-resistance of the switching MOS FET becomes large to cause much loss unless the gate voltage is set to be higher than the power source voltage.

On the other hand, if a P channel MOS FET is used as a switching element for the transmission/interception of a DC voltage, no charge pumps are necessary because the channel can conduct by applying the ground potential to the gate terminal. But, if the P channel MOS FET and the N channel MOS FET have the same size, the P channel MOS FET has a larger on-resistance than that of the N channel MOS FET because the P channel MOS FET has holes as the carriers thereof and the N channel MOS FET has electrons as the carriers thereof. Accordingly, the P channel MOS FET having a large size must be used, and consequently the occupation area of the switching element is large. Because the increased quantity of the chip size owing to the large occupation area is larger than the decreased quantity of the chip size owing to the omission of the charge pump, the P channel MOS FET has a problem of the increase of the chip size thereof also in the case of total consideration.

Moreover, even if either of the P channel type and the N channel type MOS FETs is used as the switching element, a device for preventing a reverse current from flowing through a parasitic diode existing between the source and drain region of the switching element and the substrate thereof during the off-state thereof becomes necessary. The inventions, each preventing a reverse current by applying the higher one of an input voltage and an output voltage to a substrate (well region) as a substrate bias voltage in a power source apparatus (regulator) using a P channel MOS FET as a switching element for transmission/interception, have been proposed in the past (see Patent Literature 1 and Patent Literature 2).

CITATION LIST

Patent Literature

{Patent Literature 1} Japanese Patent Application Laid-Open Publication No. Sho 63-307510
{Patent Literature 2} Japanese Patent Application Laid-Open Publication No. 2004-280704

SUMMARY OF INVENTION

Technical Problem

However, any of the reverse current preventing techniques of the inventions described in the pieces of Patent Literature 1 and 2 concerns the case of using a P channel MOS FET, and can effectively prevent any reverse currents by applying a higher one of an input voltage and an output voltage as a substrate bias voltage. The inventors of the present invention examined the prevention of any reverse currents in the case of using an N channel MOS FET as a switching element for voltage transmission/interception.

Because the substrate of the N channel MOS FET is a P channel, a reverse current will flow through a parasitic diode as shown in FIG. 5A even in the off-state of the N channel MOS FET when the output voltage thereof becomes higher than the input voltage thereof under the setting thereof of preventing any currents from flowing from the input terminal thereof to the output terminal thereof through a parasitic diode at the time of the off-state thereof by connecting the source thereof with the substrate (back gate) thereof. Accordingly, it would also appear to apply a lower voltage between the input voltage and the output voltage as the substrate bias voltage.

However, a circuit for detecting which of the input voltage and the output voltage is lower becomes necessary in order to apply the lower voltage to the substrate, and accordingly a plurality of voltage detecting circuits must be provided because at least two switching MOS FETs are provided in a power source switching apparatus, which leads to an increase in the circuit size thereof. Accordingly, the inventors considered the constant application of the ground potential, which is the lowest potential in the circuit, to the substrate of the N channel MOS FET, as shown in FIG. 5B.

The application of the ground potential to the substrate of a MOS FET in this way would prevent any reverse currents from flowing even if potential becomes higher on either of the source side thereof and the drain side thereof, and consequently no switching circuits become necessary. However, we found that the constant application of the ground potential to the substrate of an N channel MOS FET had the following problems, namely the application of the ground potential would lead to the heightening of the threshold voltage of the FET owing to a body effect at the time of turning on the FET to increase the on-resistance thereof and the loss thereof and to make it difficult to turn off the FET (the delay of the becoming of the complete off-state thereof).

This invention was made by paying our attention to the problems mentioned above, and aims to preventing any reverse currents of an N channel MOS FET from flowing therethrough even when the output voltage thereof becomes higher than the input voltage thereof and to make it possible to avoid the heightening of the threshold voltage of a switching element for voltage transmission/interception, provided between the input terminal and the output terminal of a power source switching apparatus using the N channel MOS FET as the switching element, owing to the body effect, which heightening increases the on-resistance of the switching element to increase the loss thereof.

Another object of this invention is to make it possible to prevent the reverse currents when the output voltage of an N channel MOS FET becomes higher than the input voltage thereof without so increasing the circuit size thereof in a power source switching apparatus using the N channel MOS FET as a switching element for voltage transmission/interception provided between the input terminal of the apparatus and the output terminal thereof.

Solution to Problem

To achieve at least one of the aforementioned objects or other objects, embodiments of the present invention are provided as follows.

In order to achieve at least one of the objects mentioned above, this invention is a reverse current preventing circuit of an N channel type switching MOS transistor connected between a voltage input terminal and an output terminal to control a conduction state between the voltage input terminal and the output terminal, the circuit comprising: a first MOS transistor connected between a substrate of the switching MOS transistor and a ground point; and a second MOS transistor connected between the substrate of the switching MOS transistor and a point having a piece of predetermined constant potential higher than that of the ground point, wherein the piece of predetermined constant potential higher than that of the ground point is applied to the substrate of the switching MOS transistor while the switching MOS transistor is made to be in its on-state, and ground potential is applied to the substrate of the switching MOS transistor while the switching MOS transistor is made to be in its off-state.

To put it more concretely, this invention is a reverse current preventing circuit of an N channel type switching MOS transistor connected between a voltage input terminal and an output terminal, the switching MOS transistor controlling a conduction state between the voltage input terminal and the output terminal, the circuit comprising: a first MOS transistor connected between a substrate of the switching MOS transistor and a ground point; and a second MOS transistor connected between the substrate of the switching MOS transistor and the output terminal or the voltage input terminal, wherein the first MOS transistor is made to be in its off-state and the second MOS transistor is made to be its on-state while the switching MOS transistor is made to be in its on-state, and the first MOS transistor is made to be in its on-state and the second MOS transistor is made to be in its off-state while the switching MOS transistor is made to be in its off-state.

According to the means mentioned above, even when an output voltage becomes higher than an input voltage, no reverse currents flow, and it is possible to avoid the increase of the loss of the switching MOS transistor caused by the heightening of the threshold voltage thereof owing to a body effect and by the increase of the on-resistance thereof.

Here, preferably, the first MOS transistor is an N channel type MOS transistor; the second MOS transistor is a P channel type MOS transistor; and a signal having a phase reverse to that of a control signal to be applied to a gate terminal of the switching MOS transistor is applied to gate terminals of the first and second MOS transistors. Hereby, the signal for controlling the MOS transistors that selectively supply the potential to be applied to the substrate of the switching MOS transistor can simply be obtained, and the increase of the circuit size can be suppressed.

Moreover, another invention of the present application is a power source switching apparatus comprising: an N channel type first switching MOS transistor connected between a first voltage input terminal, to which a first DC voltage is input, and an output terminal, the first switching MOS transistor controlling a conduction state between the first voltage input terminal and the output terminal; an N channel type second switching MOS transistor connected between a second voltage input terminal, to which a second DC voltage is input, and the output terminal, the second switching MOS transistor controlling a conduction state between the second voltage input terminal and the output terminal; a first reverse current preventing circuit provided correspondingly to the first switching MOS transistor; and a control circuit for generating control signals to be respectively applied to gate terminals of the first and second switching MOS transistors according to voltages of the first and second voltage input terminals, wherein the power source switching apparatus selects either of the voltages at the first and second voltage input terminals, to supply the selected voltage to the output terminal, wherein the first reverse current preventing circuit includes: a first MOS transistor connected between a substrate of the first switching MOS transistor and a ground point; and a second MOS transistor connected between the substrate of the first switching MOS transistor and the output terminal or the voltage input terminal, wherein the first MOS transistor is made to be in its off-state and the second MOS transistor is made to be in its on-state while the first switching MOS transistor is made to be in its on-state; and the first MOS transistor is made to be in its on-state and the second MOS transistor is made to be in its off-state while the first switching MOS transistor is made to be in its off-state.

According to the means mentioned above, even when an output voltage becomes higher than an input voltage, no reverse currents flow, and it is possible to avoid the increase of the loss of the switching MOS transistor caused by the heightening of the threshold voltage thereof owing to a body effect and by the increase of the on-resistance thereof.

Here, preferably, the power source switching apparatus further comprises a second reverse current preventing circuit provided correspondingly to the second switching MOS transistor, wherein the second reverse current preventing circuit includes: a third MOS transistor connected between a substrate of the second switching MOS transistor and the ground point; and a fourth MOS transistor connected between the substrate of the second switching MOS transistor and the output terminal or the voltage input terminal, wherein the third MOS transistor is made to be in its off-state and the fourth MOS transistor is made to be in its on-state while the second switching MOS transistor is made to be in its on-state; and the third MOS transistor is made to be in its on-state and the fourth MOS transistor is made to be in its off-state while the second switching MOS transistor is made to be in its off-state. Hereby, the reverse currents of both the two switching MOS transistors can be prevented in the power source switching apparatus including the two switching MOS transistors connected between the voltage input terminals and the output terminal, respectively.

Moreover, preferably, the first and third MOS transistors are severally an N channel type MOS transistor, and the second and fourth MOS transistors are severally a P channel type MOS transistor; a signal having a phase reverse to that of a first control signal to be applied to the gate terminal of the first switching MOS transistor is applied to gate terminals of the first and second MOS transistors; and a signal having a phase reverse to that of a second control signal to be applied to the gate terminal of the second switching MOS transistor is applied to gate terminals of the third and fourth MOS transistors. Hereby, the signals for controlling the MOS transistors that selectively supply the potential to be applied to the substrates of the switching MOS transistors can simply be obtained, and the increase of the circuit size can be suppressed.

Furthermore, preferably, the power source switching apparatus further comprises a boosting circuit boosting the DC voltage input into the first voltage input terminal or the second voltage input terminal, wherein high levels of the first control signal, the signal having the phase reverse to that of the first control signal, the second control signal and the signal having the phase reverse to that of the second control signal are severally potential of a voltage boosted by the boosting circuit. Hereby, the resistances when the switching MOS transistors are turned on can be reduced.

Advantageous Effects of Invention

According to the present invention, in a power source switching apparatus using an N channel MOS FET as a switching element for voltage transmission/interception, provided between the input terminal of the apparatus and the output terminal thereof, no reverse currents flow even if an output voltage becomes higher than an input voltage, and it can be avoided that the threshold voltage of the switching element becomes high owing to a body effect and the on-resistance of the switching element increases to increase the loss thereof. Moreover, the apparatus has an effect that it becomes possible to prevent any reverse currents when an output voltage becomes higher than an input voltage without so increasing the circuit size thereof.

DESCRIPTION OF EMBODIMENTS

In the following, a suitable embodiment of the present invention will be described with reference to drawings.

Figure 1:
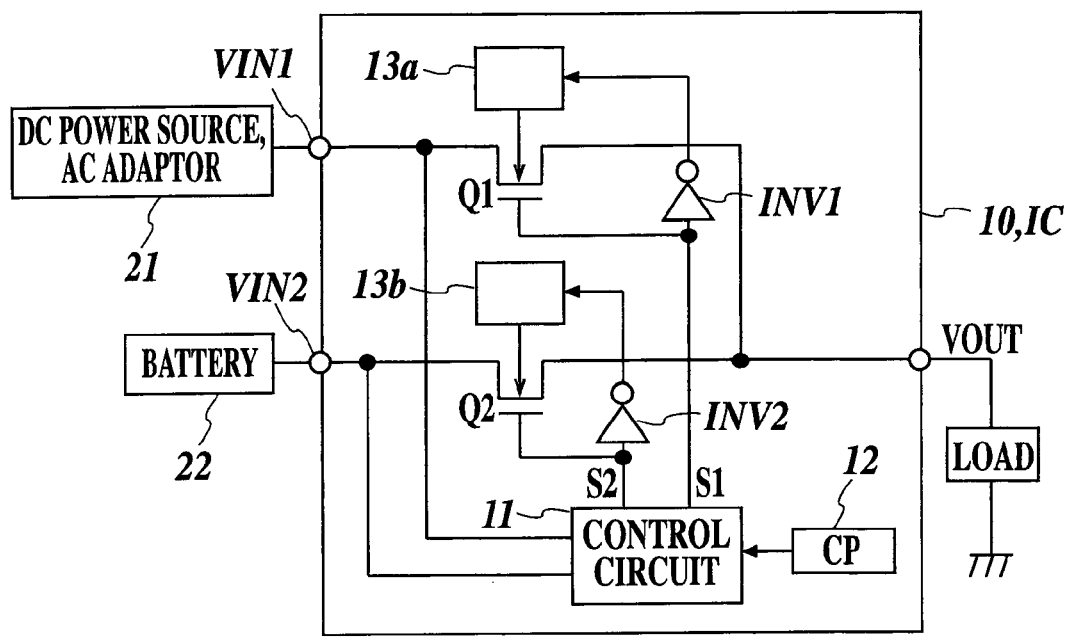
FIG. 1 is a schematic configuration diagram showing an embodiment of a power source switching apparatus to which the present invention can suitably be applied.

FIG. 1 shows the schematic configuration of an embodiment of a power source switching apparatus, to which the present invention is applied. In this embodiment, each element constituting the power source switching apparatus is formed on one semiconductor chip to be configured as a semiconductor integrated circuit (power source switching IC), although the invention is not especially limited to the configuration.

As shown in FIG. 1, a power source switching IC 10 of this embodiment includes a first voltage input terminal VIN1, to which a DC voltage from an external DC power source 21, such as an AC adaptor, is input, a second voltage input terminal VIN2, to which a primary battery 22, such as an alkaline battery, is connected, an output terminal OUT, to which a load is connected, a first switching MOS transistor Q1, which is provided between the first voltage input terminal VIN1 and the output terminal OUT and is made of an N channel MOS FET (insulated-gate type field-effect transistor; hereinafter referred to as an MOS transistor), and a second switching MOS transistor Q2, which is provided between the second voltage input terminal VIN2 and the output terminal OUT and is made of an N channel MOS FET.

Moreover, the power source switching IC 10 includes a control circuit 11 monitoring the voltages at input terminals VIN1 and VIN2 to generate control signals S1 and S2 for performing the on-off control of the switching MOS transistors Q1 and Q2, respectively, a charge pump 12 for raising the high levels of the control signals S1 and S2 output from the control circuit 11 to an input voltage or more to make the on-resistances of the switching MOS transistors Q1 and Q2 small, and substrate potential switching circuits 13a and 13b switching the substrate potential of the switching MOS transistors Q1 and Q2, respectively, according to the on-off states of the switching MOS transistors Q1 and Q2, respectively.

The substrate potential switching circuit 13a is controlled by a signal generated by inverting the control signal S1 with an inverter INV1, and the substrate potential switching circuit 13b is controlled by a signal generated by inverting the control signal S2 with an inverter INV2. The power source switching IC 10 is configured so that the voltages boosted by the charge pump 12 may be also supplied to these inverters INV1 and INV2 as their power source voltages.

In this embodiment, when a DC voltage is input only into the input terminal VIN1, the control circuit 11 outputs the control signals S1 and S2 for turning on the switching MOS transistor Q1 and turning off the switching MOS transistor Q2. When a DC voltage is input only into the input terminal VIN2, the control circuit 11 outputs the control signals S1 and S2 for turning off the switching MOS transistor Q1 and turning on the switching MOS transistor Q2.

Furthermore, the power source switching IC 10 is configured so that, when DC voltages are simultaneously input into both of the input terminals VIN1 and VIN2, the control circuit 11 may output the control signals S1 and S2 for turning on the switching MOS transistor Q1 and turning off the switching MOS transistor Q2 to give high priority to the DC voltage of the AC adaptor 21 as the external DC power source to transmit the DC voltage to the output terminal OUT. In order to enable such control, the control circuit 11 is provided with a detection circuit detecting whether the voltages from the AC adaptor 21 and the battery 22 are applied to the input terminals VIN1 and VIN2, respectively, or not.

Figure 2:
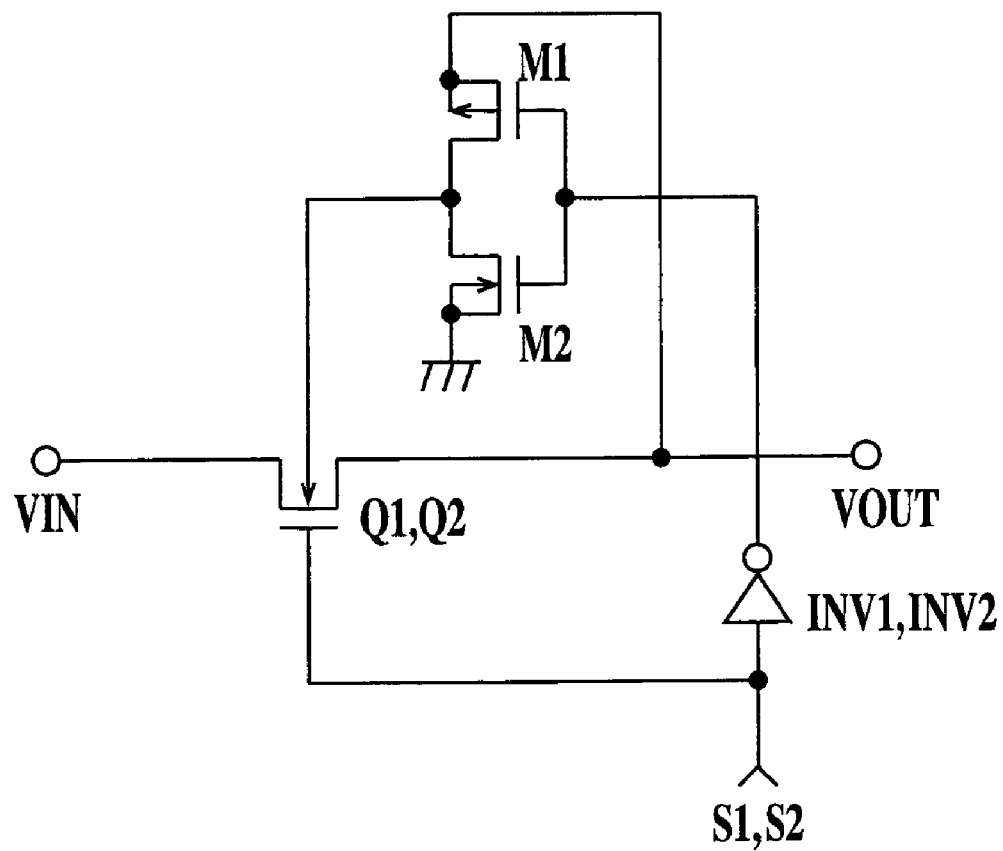
FIG. 2 is a circuit diagram showing an example of a substrate potential switching circuit in the power source switching apparatus according to the present invention.

FIG. 2 shows a concrete circuit example of the substrate potential switching circuits 13a and 13b.

As shown in the said figure, the substrate potential switching circuit 13a (13b) includes a P channel MOS transistor M1 and an N channel MOS transistor M2, both connected to each other in series between the output terminal OUT and the ground point, and the output of the inverter INV1 (INV2) inverting the control signal S1 (S2) is applied to the gate terminals of the transistors M1 and M2. Moreover, the substrate (back gate) of the switching MOS transistor Q1 (Q2) is connected to the common drain of the transistors M1 and M2.

Figure 3A:
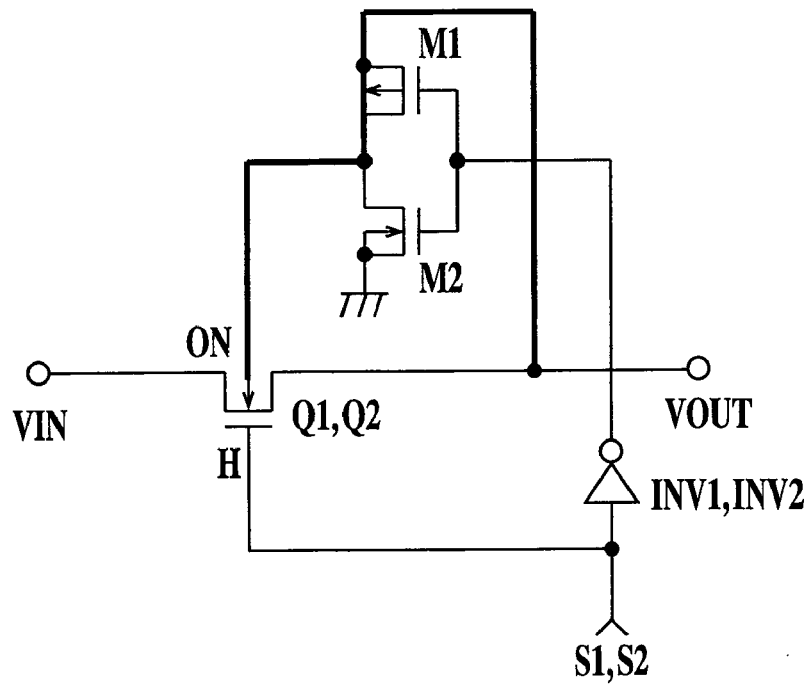
FIG. 3A is a circuit explanatory diagram showing a substrate potential transmitting route in the on-state of a switching MOS transistor in the substrate potential switching circuit in FIG. 2.

Hereby, when the switching MOS transistor Q1 (Q2) is changed to be in the on-state thereof by the control signal S1 (S2), then the P channel MOS transistor M1 of the substrate potential switching circuit 13a (13b) is changed to be in the on-state thereof, and the voltage on the side of the output terminal OUT is applied to the substrate of the transistor Q1 (Q2) as shown by the thick line in FIG. 3A. As a result, no changes of a threshold voltage owing to a body effect exist, and the increase of the on-resistance of the transistor Q1 (Q2) can be prevented.

Figure 3B:
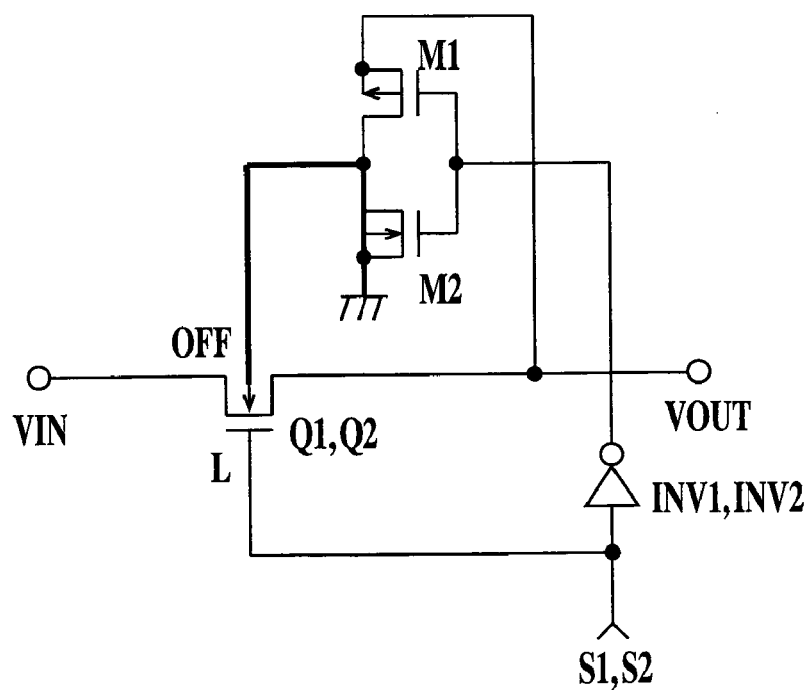
FIG. 3B is a circuit explanatory diagram showing a substrate potential transmitting route in the off-state of the switching MOS transistor in the substrate potential switching circuit in FIG. 2.

On the other hand, when the switching MOS transistor Q1 (Q2) is changed to be in the off-state thereof by the control signal S1 (S2), then the N channel MOS transistor M2 of the substrate potential switching circuit 13a (13b) is changed to be in the on-state thereof, and the ground potential is applied to the substrate of the transistor Q1 (Q2) as shown by the thick line of FIG. 3B. As a result, even if the voltage on the side of the output terminal OUT becomes higher than the voltage on the side of the input terminal VIN, it can be prevented that a reverse current flows through a parasitic diode existing between the substrate and the source and drain region.

Figure 4:
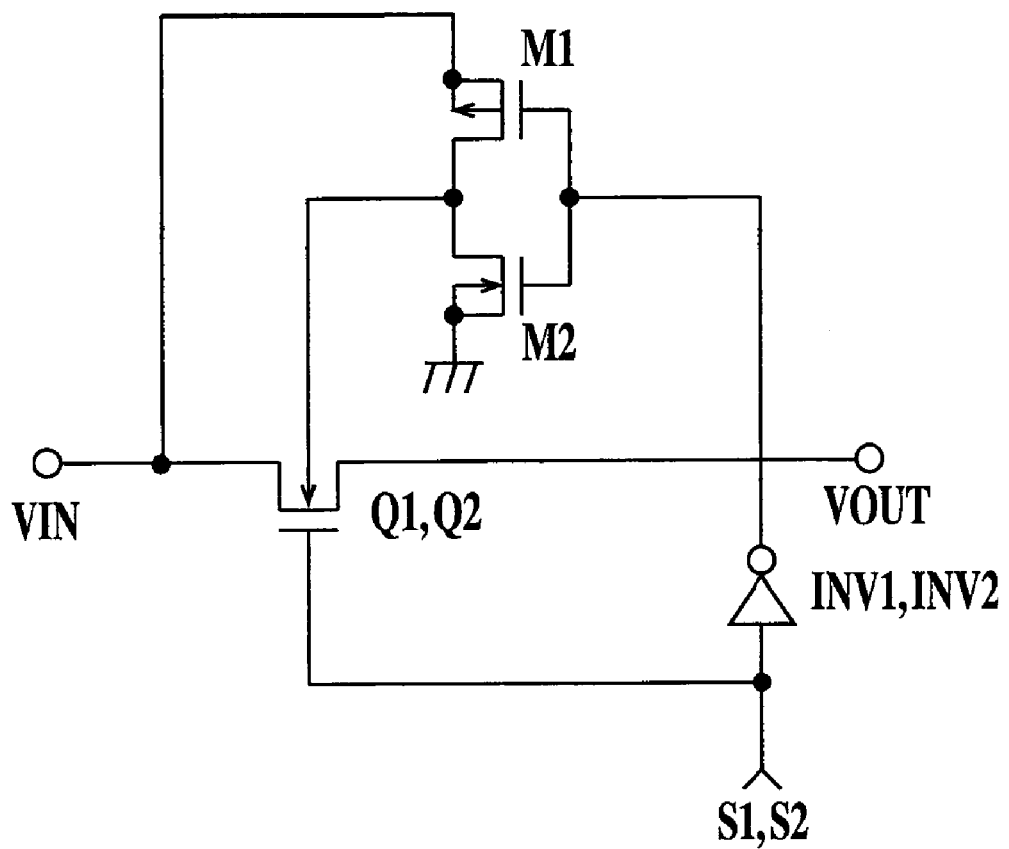
FIG. 4 is a circuit diagram showing a modification of the substrate potential switching circuit of FIG. 2.
Figure 5A:
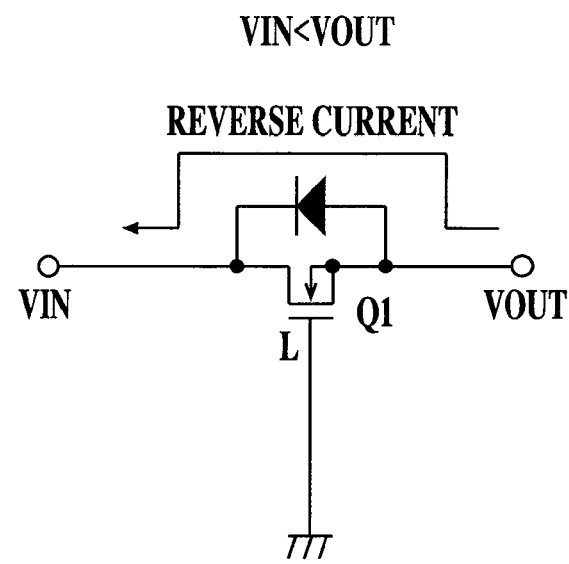
FIGS. 5A and 5B are circuit explanatory diagrams showing an example of a reverse current preventing measure in an N channel type MOS FET, which measure has been examined prior to the present invention.
Figure 5B:
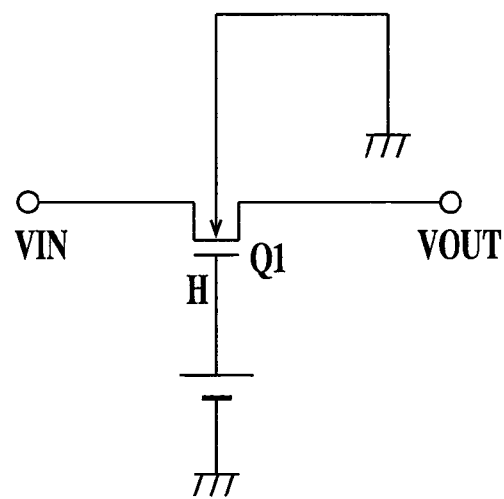

FIG. 4 shows a modification of the substrate potential switching circuit 13a (13b) in the aforesaid embodiment. This modification is configured so that the voltage on the side of the input terminal VIN may be applied to the substrate of the switching MOS transistor Q1 (Q2) when the transistor Q1 (Q2) is changed to be in the on-state thereof by connecting the source terminal of the P channel MOS transistor M1 to the input terminal VIN in place of the output terminal OUT. Even if the substrate potential switching circuit is configured in this way, the substrate potential switching circuit has the advantage that the changes of the threshold voltage owing to the body effect can be eliminated and the increase of the on-resistance of the transistor Q1 (Q2) can be prevented similarly to the substrate potential switching circuit of FIG. 2.

However, if the source terminal of the P channel MOS transistor M1 is connected to the input terminal VIN as shown in FIG. 4, then it would also appear, for example, that the transistor M1 is accidentally turned on because noise is included in an output of the inverter INV1 (INV2) when the switching MOS transistor Q1 (Q2) is in the off-state thereof and a current flows from the input terminal VIN to the side of the output terminal OUT through a parasitic diode. Accordingly, the source terminal of the P channel MOS transistor M1 is desirably connected to the output terminal OUT as shown in the example of FIG. 2.

An embodiment of the present invention has been described in the above, but the present invention is not limited to the embodiment described above. Various changes can be performed on the basis of the technical idea of the present invention. For example, the power source switching apparatus of the embodiment of FIG. 1 has been described to be provided with two DC input terminals Vin1 and VIN2, but the present invention can be applied to a power source switching apparatus provided with three or more DC input terminals.

Moreover, the power source switching apparatus of the embodiment is provided with the inverters INV1 and INV2 generating the control signals of the substrate potential switching circuits 13a and 13b of the switching MOS transistors Q1 and Q2, respectively. But, because the transistors Q1 and Q2 are not in their on-states at the same time, the inverters INV1 and INV2 can be omitted by applying the gate control signal S1 of the transistor Q1 to the gate terminal of the transistor M2 and by applying the gate control signal S2 of the transistor Q2 to the gate terminal of the transistor M1.

Furthermore, if either of the voltages at the input terminals VIN1 and VIN2 is always higher than the voltage at the other one in the embodiment of FIG. 1, then it is also possible to configure the power source switching apparatus so as to provide only the substrate potential switching circuit corresponding to the switching MOS transistor connected to the input terminal into which the lower voltage is input between the substrate potential switching circuits 13a and 13b, and so as to omit the other substrate potential switching circuit.

Moreover, although the example in which the present invention is applied to the power source switching apparatus has been described in the above, the present invention is not limited to the power source switching apparatus, but can be utilized for a DC power source circuit such as a series regulator.

Although various exemplary embodiments have been shown and described, the invention is not limited to the embodiments shown. Therefore, the scope of the invention is intended to be limited solely by the scope of the claims that follow.

The entire disclosure of Japanese Patent Applications No. 2009-051704 filed on Mar. 5, 2009 including specifications, claims, drawings and summaries are incorporated herein by reference in their entirety.

REFERENCE SIGNS LIST 10 power source switching apparatus (power source switching IC)
11 control circuit
12 charge pump
13a, 13b substrate potential switching circuit
21 external DC power source (AC adaptor)
22 primary battery
Q1, Q2 switching MOS transistor composed of N channel MOS FET
M1, M2 MOS transistor constituting substrate potential switching circuit

The invention claimed is:

1. A reverse current preventing circuit of an N channel type switching MOS transistor connected between a voltage input terminal and an output terminal to control a conduction state between the voltage input terminal and the output terminal, the circuit comprising:

a first MOS transistor connected between a substrate of the switching MOS transistor and a ground point; and a second MOS transistor connected between the substrate of the switching MOS transistor and a point having a piece of predetermined constant potential higher than that of the ground point, wherein the piece of predetermined constant potential higher than that of the ground point is applied to the substrate of the switching MOS transistor while the switching MOS transistor is made to be in its on-state, and ground potential is applied to the substrate of the switching MOS transistor while the switching MOS transistor is made to be in its off-state.

2. The reverse current preventing circuit according to claim 1, wherein
the first MOS transistor is an N channel type MOS transistor;
the second MOS transistor is a P channel type MOS transistor; and
a signal having a phase reverse to that of a control signal to be applied to a gate terminal of the switching MOS transistor is applied to gate terminals of the first and second MOS transistors.

3. A reverse current preventing circuit of an N channel type switching MOS transistor connected between a voltage input terminal and an output terminal, the switching MOS transistor controlling a conduction state between the voltage input terminal and the output terminal, the circuit comprising:
a first MOS transistor connected between a substrate of the switching MOS transistor and a ground point; and
a second MOS transistor connected between the substrate of the switching MOS transistor and the output terminal or the voltage input terminal, wherein
the first MOS transistor is made to be in its off-state and the second MOS transistor is made to be in its on-state while the switching MOS transistor is made to be in its on-state, and
the first MOS transistor is made to be in its on-state and the second MOS transistor is made to be in its off-state while the switching MOS transistor is made to be in its off-state.

4. A power source switching apparatus comprising:
an N channel type first switching MOS transistor connected between a first voltage input terminal, to which a first DC voltage is input, and an output terminal, the first switching MOS transistor controlling a conduction state between the first voltage input terminal and the output terminal;
an N channel type second switching MOS transistor connected between a second voltage input terminal, to which a second DC voltage is input, and the output terminal, the second switching MOS transistor controlling a conduction state between the second voltage input terminal and the output terminal;
a first reverse current preventing circuit provided correspondingly to the first switching MOS transistor; and
a control circuit for generating control signals to be respectively applied to gate terminals of the first and second switching MOS transistors according to voltages of the first and second voltage input terminals, wherein
the power source switching apparatus selects either of the voltages at the first and second voltage input terminals, to supply the selected voltage to the output terminal, wherein
the first reverse current preventing circuit includes:
a first MOS transistor connected between a substrate of the first switching MOS transistor and a ground point; and
a second MOS transistor connected between the substrate of the first switching MOS transistor and the output terminal or the voltage input terminal, wherein
the first MOS transistor is made to be in its off-state and the second MOS transistor is made to be in its on-state while the first switching MOS transistor is made to be in its on-state; and
the first MOS transistor is made to be in its on-state and the second MOS transistor is made to be in its off-state while the first switching MOS transistor is made to be in its off-state.

5. The power source switching apparatus according to claim 4, further comprising a second reverse current preventing circuit provided correspondingly to the second switching MOS transistor, wherein
the second reverse current preventing circuit includes:
a third MOS transistor connected between a substrate of the second switching MOS transistor and the ground point; and
a fourth MOS transistor connected between the substrate of the second switching MOS transistor and the output terminal or the voltage input terminal, wherein
the third MOS transistor is made to be in its off-state and the fourth MOS transistor is made to be in its on-state while the second switching MOS transistor is made to be in its on-state; and
the third MOS transistor is made to be in its on-state and the fourth MOS transistor is made to be in its off-state while the second switching MOS transistor is made to be in its off-state.

6. The power source switching apparatus according to claim 4, wherein
the first and third MOS transistors are severally an N channel type MOS transistor, and the second and fourth MOS transistors are severally a P channel type MOS transistor;
a signal having a phase reverse to that of a first control signal to be applied to the gate terminal of the first switching MOS transistor is applied to gate terminals of the first and second MOS transistors; and
a signal having a phase reverse to that of a second control signal to be applied to the gate terminal of the second switching MOS transistor is applied to gate terminals of the third and fourth MOS transistors.

7. The power source switching apparatus according to claim 6, further comprising a boosting circuit boosting the DC voltage input into the first voltage input terminal or the second voltage input terminal, wherein
high levels of the first control signal, the signal having the phase reverse to that of the first control signal, the second control signal and the signal having the phase reverse to that of the second control signal are severally potential of a voltage boosted by the boosting circuit.

* * * * *